(12) United States Patent
Huo et al.

(10) Patent No.: US 10,884,505 B1
(45) Date of Patent: Jan. 5, 2021

(54) SYSTEMS AND METHODS FOR TRANSITIONING TO HIGHER ORDER DEGREE-OF-FREEDOM TRACKING

(71) Applicant: Facebook Technologies, LLC, Menlo Park, CA (US)

(72) Inventors: Ke Huo, Issaquah, WA (US); Chengyuan Yan, Fremont, CA (US)

(73) Assignee: Facebook Technologies, LLC, Menlo Park, CA (US)

(*) Notice: Subject to any disclaimer, the term of this patent is extended or adjusted under 35 U.S.C. 154(b) by 0 days.

(21) Appl. No.: 16/183,692

(22) Filed: Nov. 7, 2018

(51) Int. Cl.
*G06F 3/01* (2006.01)
*G01R 33/32* (2006.01)

(52) U.S. Cl.
CPC ............ *G06F 3/017* (2013.01); *G01R 33/32* (2013.01); *G06F 3/012* (2013.01); *G06F 3/014* (2013.01)

(58) Field of Classification Search
CPC .......... G06F 3/012; G06F 3/014; G06F 3/017; G01R 33/32
See application file for complete search history.

(56) References Cited

U.S. PATENT DOCUMENTS

| | | | | |
|---|---|---|---|---|
| 2013/0332098 | A1* | 12/2013 | Funk | G01C 17/38 702/93 |
| 2016/0007849 | A1* | 1/2016 | Krueger | A61B 3/113 600/301 |
| 2016/0161241 | A1* | 6/2016 | Li | G01R 33/0064 324/207.21 |
| 2016/0216783 | A1* | 7/2016 | Nicholson | G06F 3/03545 |
| 2017/0090568 | A1* | 3/2017 | Chen | G06F 3/014 |
| 2019/0302903 | A1* | 10/2019 | Atlas | G06F 3/0346 |

OTHER PUBLICATIONS

Yoon et al., "TRing: Instant and Customizable Interactions with Objects Using an Embedded Magnet and a Finger-Worn Device", URL: https://engineering.purdue.edu/cdesign/wpitring-instant-and-customizable-interactions-with-objects-using-an-embedded-magnet-and-a-finger-worn-device/, Proceedings of the 29th Annual ACM Symposium on User Interface Software & Technology (UIST'16), 2016, 2 pages.

Chen et al., "uTrack: 3D Input Using Two Magnetic Sensors", URL: https://ubicomplab.cs.washington.edu/pdfs/utrack.pdf, UIST, Oct. 8-11, 2013, pp. 237-244.

Chan et al., "FingerPad: Private and Subtle Interaction Using Fingertips", URL: https://www.researchgate.net/profile/Rong-Hao_Liang/publication/260714247_FingerPad_Private_and_Subtle_Interaction_Using_Fingertips/links/0deec5320f88c36639000000.pdf, UIST, Oct. 8-11, 2013, pp. 1-6.

\* cited by examiner

*Primary Examiner* — Alexander Eisen
*Assistant Examiner* — Nathaniel P Brittingham
(74) *Attorney, Agent, or Firm* — FisherBroyles, LLP

(57) ABSTRACT

The disclosed computer-implemented method may include tracking, using a low-order degree-of-freedom (DOF) mode, an orientation of a device based on input from an inertial measurement unit (IMU) of the device. The method may also include determining, using a magnetometer, that the device has entered a magnetic tracking volume defined by at least one magnet and in response to determining that the device has entered the magnetic tracking volume, transitioning from the low-order DOF mode to a high-order DOF mode that tracks a higher number of DOFs than the low-order DOF mode. The method may also include tracking, using the high-order DOF mode, the position and orientation of the device based on input from both the IMU and the magnetometer. Various other methods, systems, and computer-readable media are also disclosed.

20 Claims, 8 Drawing Sheets

SYSTEMS AND METHODS FOR TRANSITIONING TO HIGHER ORDER DEGREE-OF-FREEDOM TRACKING

BACKGROUND

Virtual reality (VR) systems and other artificial reality systems such as augmented reality (AR) systems often use a hand-held controller for a user to interact with the artificial reality. The hand-held controller may provide input into the artificial reality system which may, for example, control a virtual hand in the artificial reality system in a way that mimics the user's actual hand motions in the real world. These controllers typically include sensors that can track the motions of the user's hand along several degrees-of-freedom (DOF). For example, the user's actual manipulation of the controller may translate into a similar manipulation of the virtual hand.

In the real world (e.g., three-dimensional space), objects typically move according to six degrees-of-freedom (6DOF). However, controllers may be limited in how many DOF can be tracked. For example, many VR/AR controllers track three degrees-of-freedom (3DOF) based on tracking orientation (e.g., pitch, yaw, and roll) of the controller using available sensors. Fully tracking 6DOF, however, often requires cost-prohibitive sensors or other specialized hardware, which may further require increased computing costs. In some systems using 3DOF controllers, 6DOF may be predicted based on mathematical models using, for example, 3DOF pose information and other available information. However, a cost-effective system for tracking 6DOF may be more accurate than simulated 6DOF tracking.

SUMMARY

As will be described in greater detail below, the instant disclosure describes systems and methods for transitioning from a low-order DOF mode to a high-order DOF mode.

In one example, a computer-implemented method for transitioning to a higher degree-of-freedom tracking may include (1) tracking, using a low-order degree-of-freedom (DOF) mode, an orientation of a device based on input from an inertial measurement unit (IMU) of the device, (2) determining, using a magnetometer, that the device has entered a magnetic tracking volume defined by at least one magnet, (3) in response to determining that the device has entered the magnetic tracking volume, transitioning from the low-order DOF mode to a high-order DOF mode that tracks a higher number of DOFs than the low-order DOF mode, and (4) tracking, using the high-order DOF mode, the position and orientation of the device based on input from both the IMU and the magnetometer.

In some examples, the position of the device may be tracked based on a magnitude of a magnetic field detected by the magnetometer and an orientation of the magnetometer with respect to the at least one magnet.

In some examples, determining that the device has entered the magnetic tracking volume may further include (a) determining a confidence magnitude based on the magnitude and at least one reference magnitude, (b) determining a confidence dip angle based on a speed of change of a dip angle of the magnetic field with respect to a reference horizontal plane and at least one reference dip angle variance, (c) determining a combined confidence value based on the confidence magnitude and the confidence dip angle, and (d) determining that the device has entered the magnetic tracking volume when the combined confidence value satisfies a combined confidence threshold. In some examples, the combined confidence threshold may be based on a running average of combined confidence values.

In some examples, the magnetic tracking volume may be defined by a plurality of magnets to increase the position tracking's precision. In some examples, the at least one magnet may comprise a passive magnet.

In some examples, the at least one magnet may be disposed in at least one of a wearable apparatus, a base station, a writing pad, or the device. In some examples, the device may comprise the magnetometer and the at least one magnet may be external to the device, or the device may comprise the at least one magnet and the magnetometer may be external to the device.

In some examples, the high-order DOF mode may track six degrees-of-freedom (6DOF) and the low-order DOF mode may track three degrees-of-freedom (3DOF).

In some examples, a device used for transitioning to a higher order DOF tracking may include an inertial measurement unit (IMU) configured to track an orientation of the device, a magnetometer configured to track a position of the device with respect to a magnetic tracking volume defined by at least one magnet, and a tracking subsystem. The tracking subsystem may be configured to (1) track, using a low-order degree-of-freedom (DOF) mode, the orientation of the device based on input from the IMU, (2) determine, using the magnetometer, that the device has entered the magnetic tracking volume, (3) in response to determining that the device has entered the magnetic tracking volume, transition from the low-order DOF mode to a high-order DOF mode that tracks a higher number of DOFs than the low-order DOF mode, and (4) track, using the high-order DOF mode, the position and orientation of the device based on input from both the IMU and the magnetometer.

In some examples, the device may comprise at least one of a hand-held controller, a glove, a stylus, or a head-mounted display.

In some examples, the position of the device may be tracked based on a magnitude of a magnetic field detected by the magnetometer and an orientation of the magnetometer with respect to the at least one magnet.

In some examples, determining that the device has entered the magnetic tracking volume may further comprise (a) determining a confidence magnitude based on the magnitude and at least one reference magnitude, (b) determining a confidence dip angle based on a speed of change of a dip angle of the magnetic field with respect to a reference horizontal plane and at least one reference dip angle variance, (c) determining a combined confidence value based on the confidence magnitude and the confidence dip angle, and (d) determining that the device has entered the magnetic tracking volume when the combined confidence value satisfies a combined confidence threshold based on a running average of combined confidence values.

In some examples, the magnetic tracking volume may be defined by a plurality of magnets to increase the position tracking's precision.

In addition, a corresponding system for transitioning to a higher DOF tracking may include at least one magnet defining a magnetic tracking volume, a device, and a processing system. The device may include an inertial measurement unit (IMU) configured to track an orientation of the device, and a magnetometer configured to track a position of the device with respect to the magnetic tracking volume. The processing system may be configured to (1) track, using a low-order degree-of-freedom (DOF) mode, the orientation of the device based on input from the IMU, (2) determine, using the magnetometer, that the device has entered the magnetic tracking volume, (3) in response to determining that the device has entered the magnetic tracking volume, transition from the low-order DOF mode to a high-order DOF mode that tracks a higher number of DOFs than the low-order DOF mode, and (4) track, using the high-order DOF mode, the position and orientation of the device based on input from both the IMU and the magnetometer.

In some examples, the device may comprise at least one of a hand-held controller, a glove, a stylus, or a head-mounted display. In some examples, the processing system may comprise at least one of a head-mounted display, a base station, or the device. In some examples, the at least one magnet may be disposed in at least one of a wearable apparatus, a base station, or a writing pad.

In some examples, tracking the position may be based on a magnitude of a magnetic field detected by the magnetometer and an orientation of the magnetometer with respect to the at least one magnet.

In some examples, determining that the device has entered the magnetic tracking volume may further comprise (a) determining a confidence magnitude based on the magnitude and at least one reference magnitude, (b) determining a confidence dip angle based on a speed of change of a dip angle of the magnetic field with respect to a reference horizontal plane and at least one reference dip angle variance, (c) determining a combined confidence value based on the confidence magnitude and the confidence dip angle, and (d) determining that the device has entered the magnetic tracking volume when the combined confidence value satisfies a combined confidence threshold based on a running average of combined confidence values.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
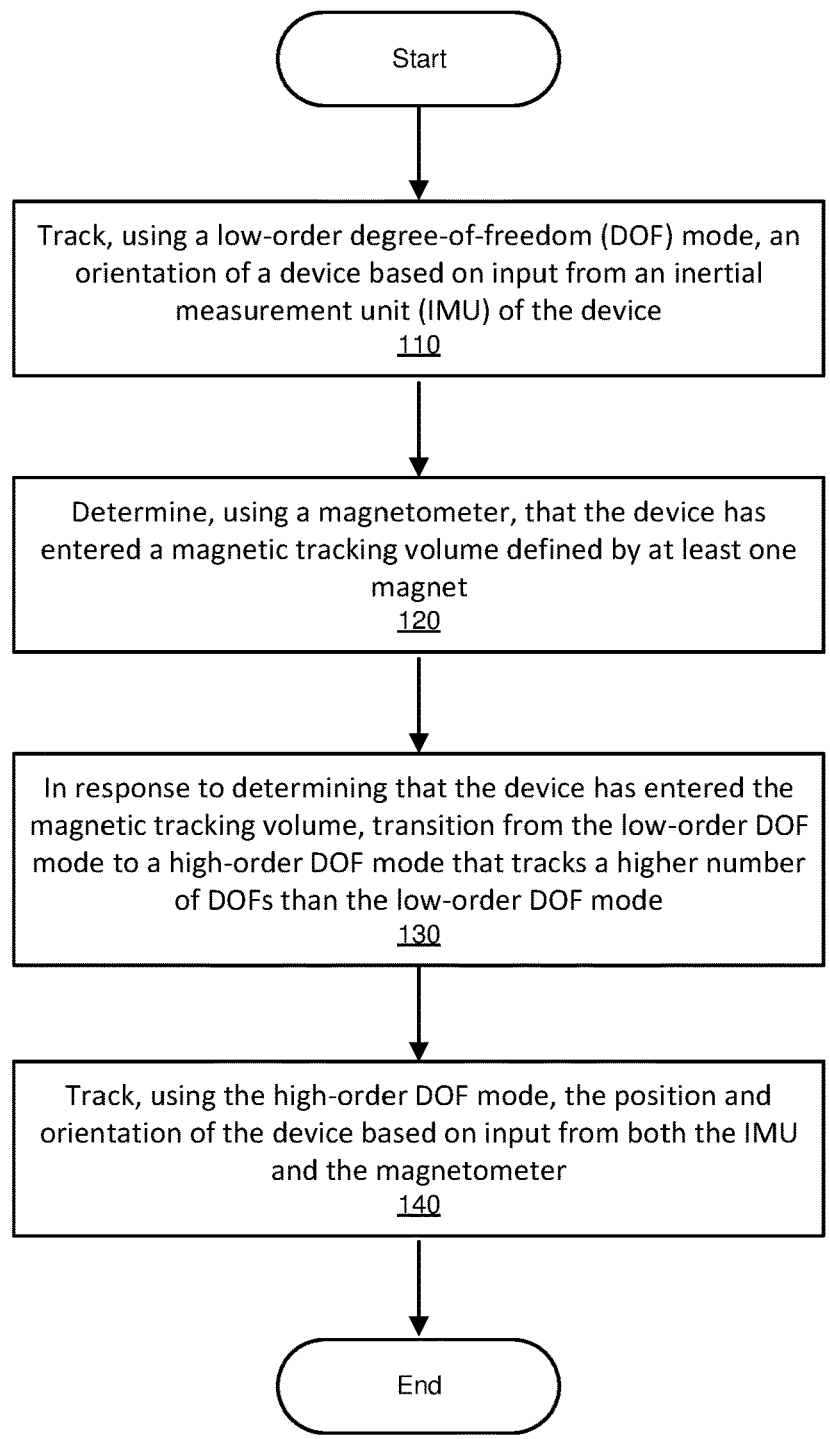
FIG. 1 is a flow diagram of an exemplary method for transitioning from a low-order DOF mode to a high-order DOF mode, according to aspects of the present disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to automatically and seamlessly transitioning between low-order and high-order DOF modes. As will be explained in greater detail below, embodiments of the instant disclosure may track user input in a low-order DOF mode, and transition into a high-order DOF mode. The low-order DOF mode may be a 3DOF tracking mode, which relies on an inertial measurement unit (IMU) of a controller to track the controller's orientation. The high-order DOF mode may be a 6DOF tracking mode, which uses a magnetometer of the controller to magnetically track the controller's position. The high-order DOF mode may be activated when the controller is detected within a magnetic tracking volume defined by a magnet that may be detected by the magnetometer. Transitions between the low-order DOF mode and the high-order DOF mode may be automatic based on whether the controller is within the magnetic tracking volume.

Embodiments of the instant disclosure may include or be implemented in conjunction with various types of artificial reality systems. Artificial reality is a form of reality that has been adjusted in some manner before presentation to a user, which may include, e.g., a virtual reality (VR), an augmented reality (AR), a mixed reality (MR), a hybrid reality, or some combination and/or derivative thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., to perform activities in) an artificial reality.

Artificial reality systems may be implemented in a variety of different form factors and configurations. Some artificial reality systems may be designed to work without near-eye displays (NEDs). Other artificial reality systems may include an NED that also provides visibility into the real world or that visually immerses a user in an artificial reality (e.g., head-mounted display device 400 in FIG. 4). While some artificial reality devices may be self-contained systems, other artificial reality devices may communicate and/or coordinate with external devices to provide an artificial reality experience to a user. Examples of such external devices include handheld controllers, mobile devices, desktop computers, devices worn by a user, devices worn by one or more other users, and/or any other suitable external system.

Although embodiments described herein may refer to particular forms of artificial reality and artificial reality devices, aspects of the present disclosure may be implemented in any artificial reality system or sub-combination thereof.

Figure 2:
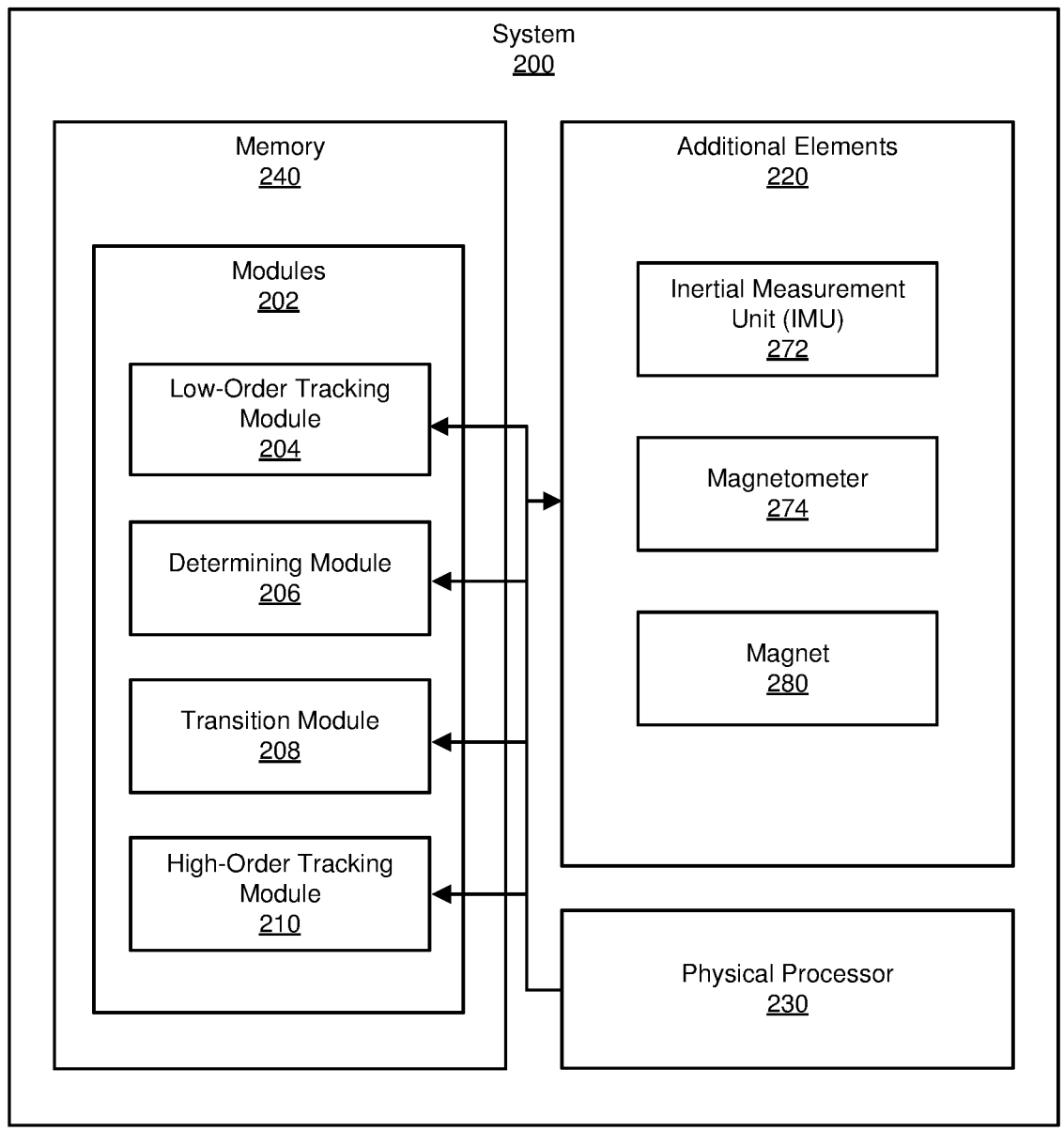
FIG. 2 is a block diagram of an exemplary system for transitioning from a low-order DOF mode to a high-order DOF mode, according to aspects of the present disclosure.
Figure 3:
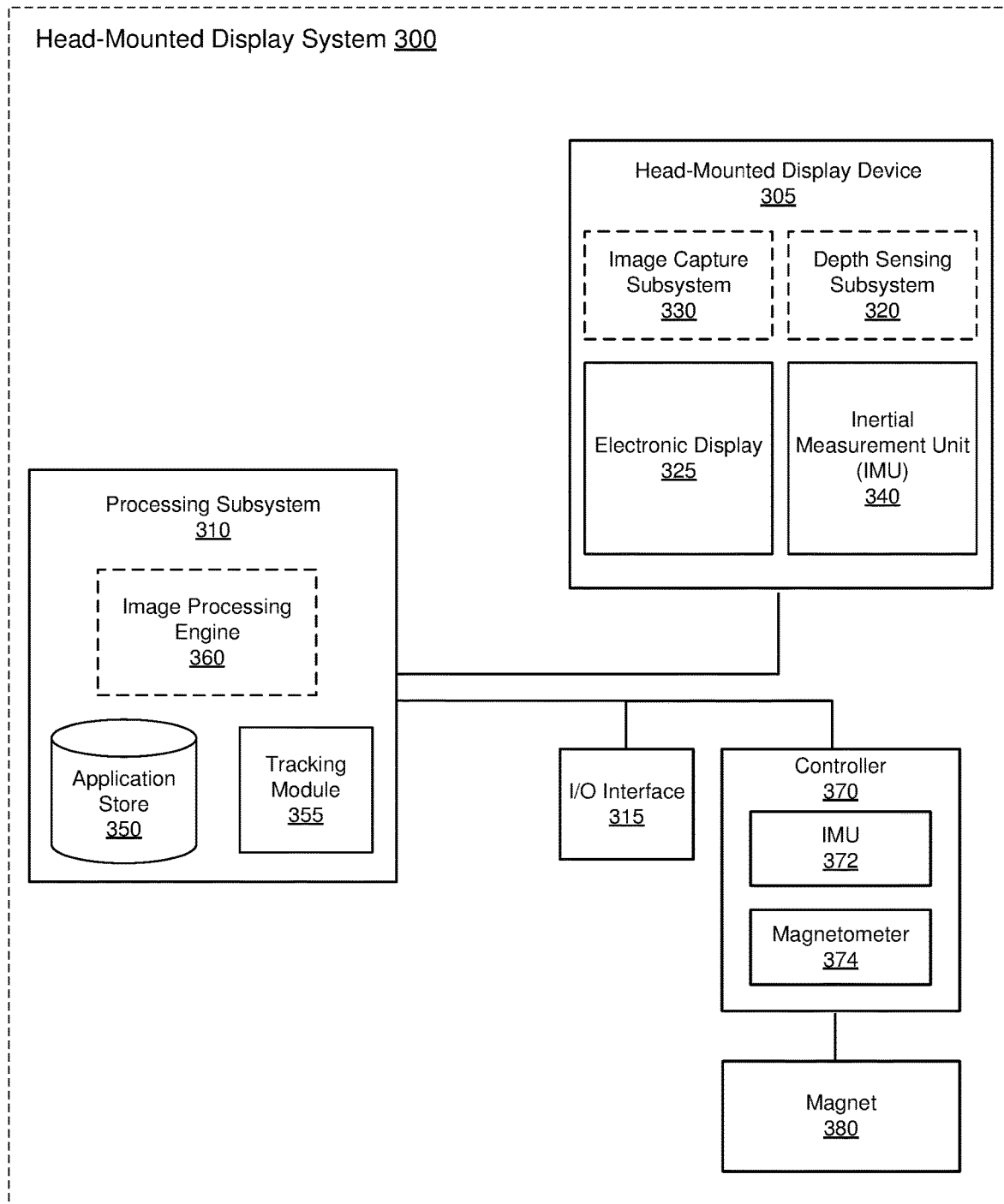
FIG. 3 is a block diagram of an exemplary head-mounted display (HMD) system, according to aspects of the present disclosure.
Figure 4:
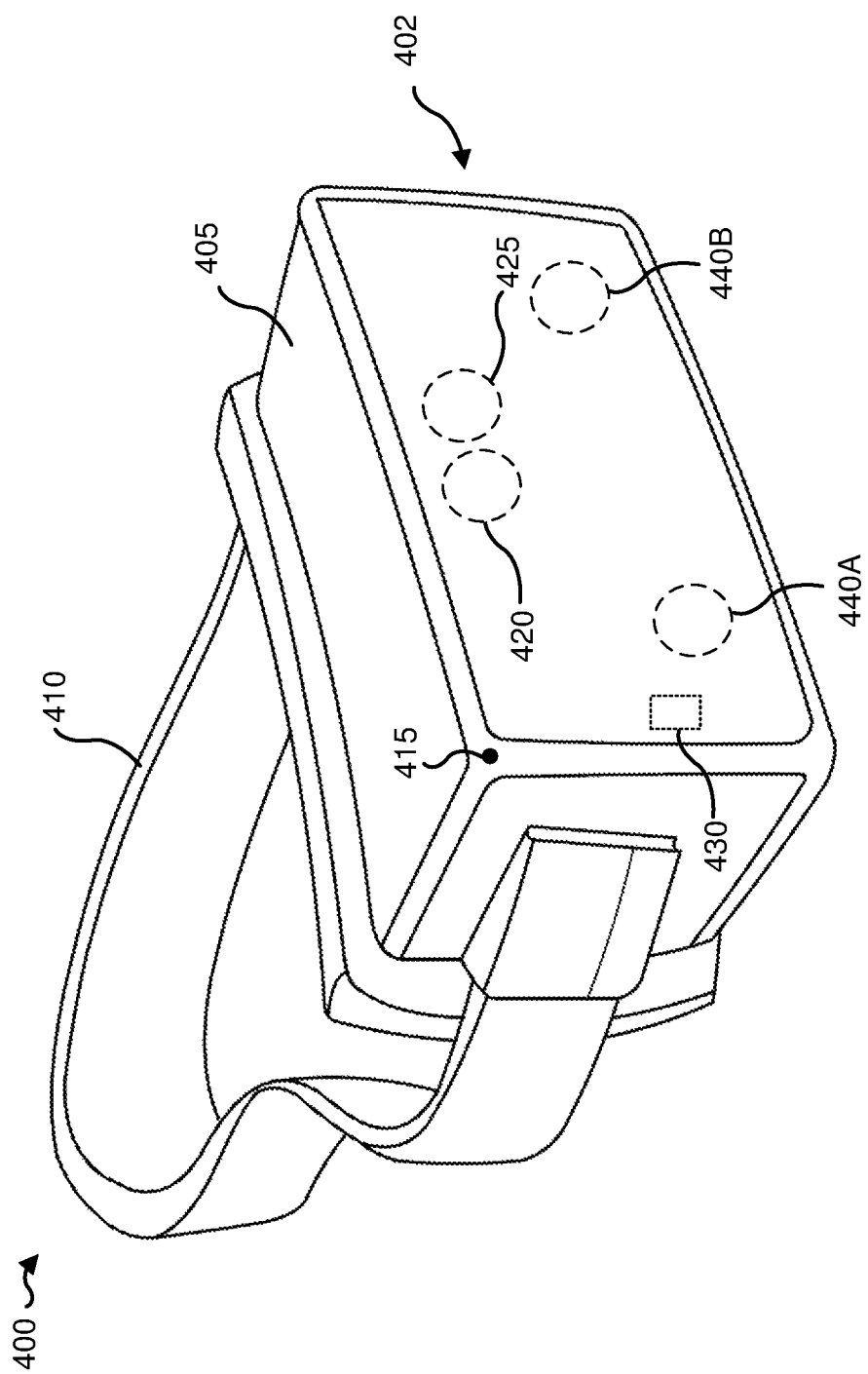
FIG. 4 is a perspective view of an exemplary HMD device that may be included in the HMD system of FIG. 3, according to aspects of the present disclosure.
Figure 5:
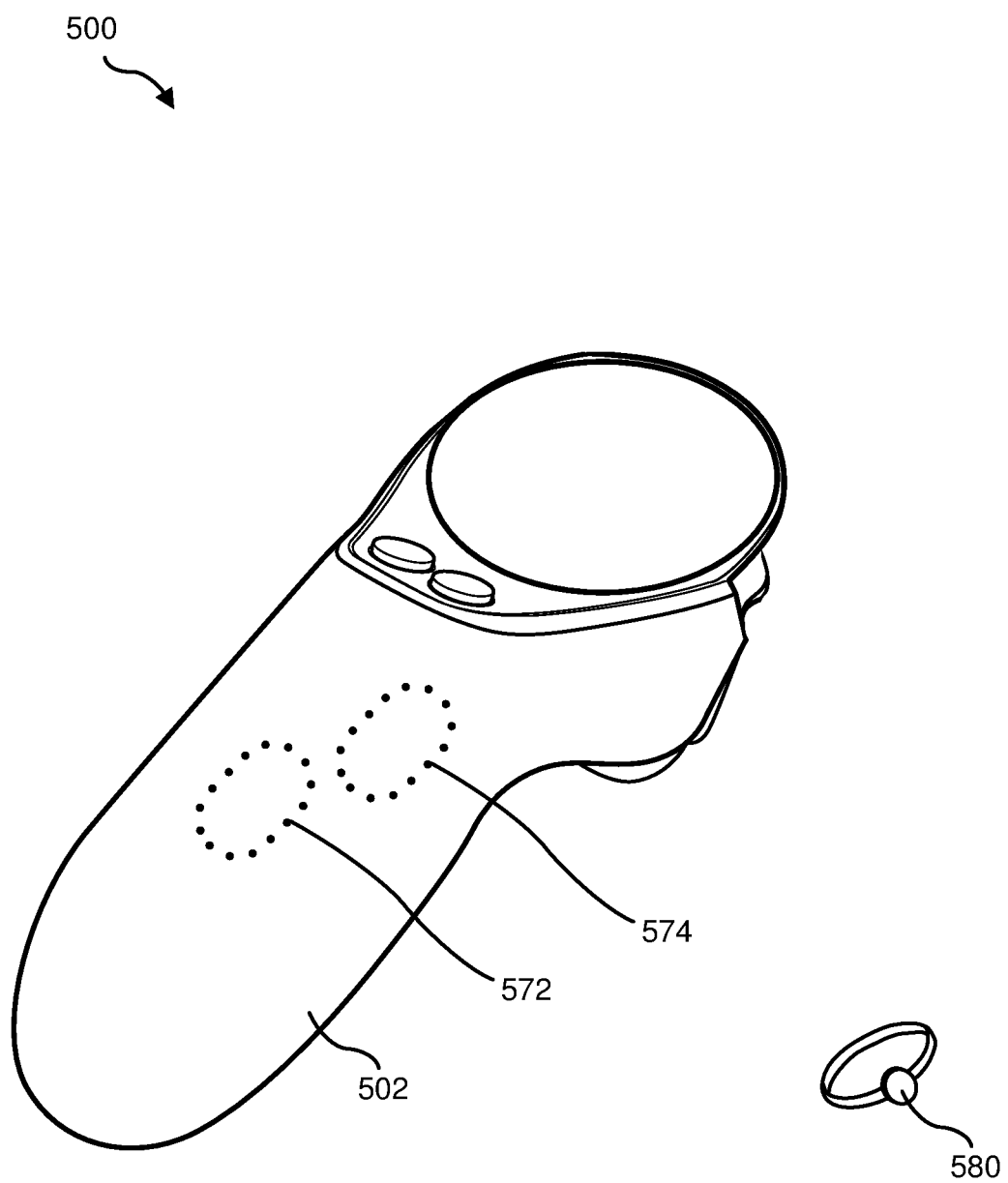
FIG. 5 is a perspective view of an exemplary hand-held controller that may be included in the HMD system of FIG. 3, according to aspects of the present disclosure.
Figure 6:
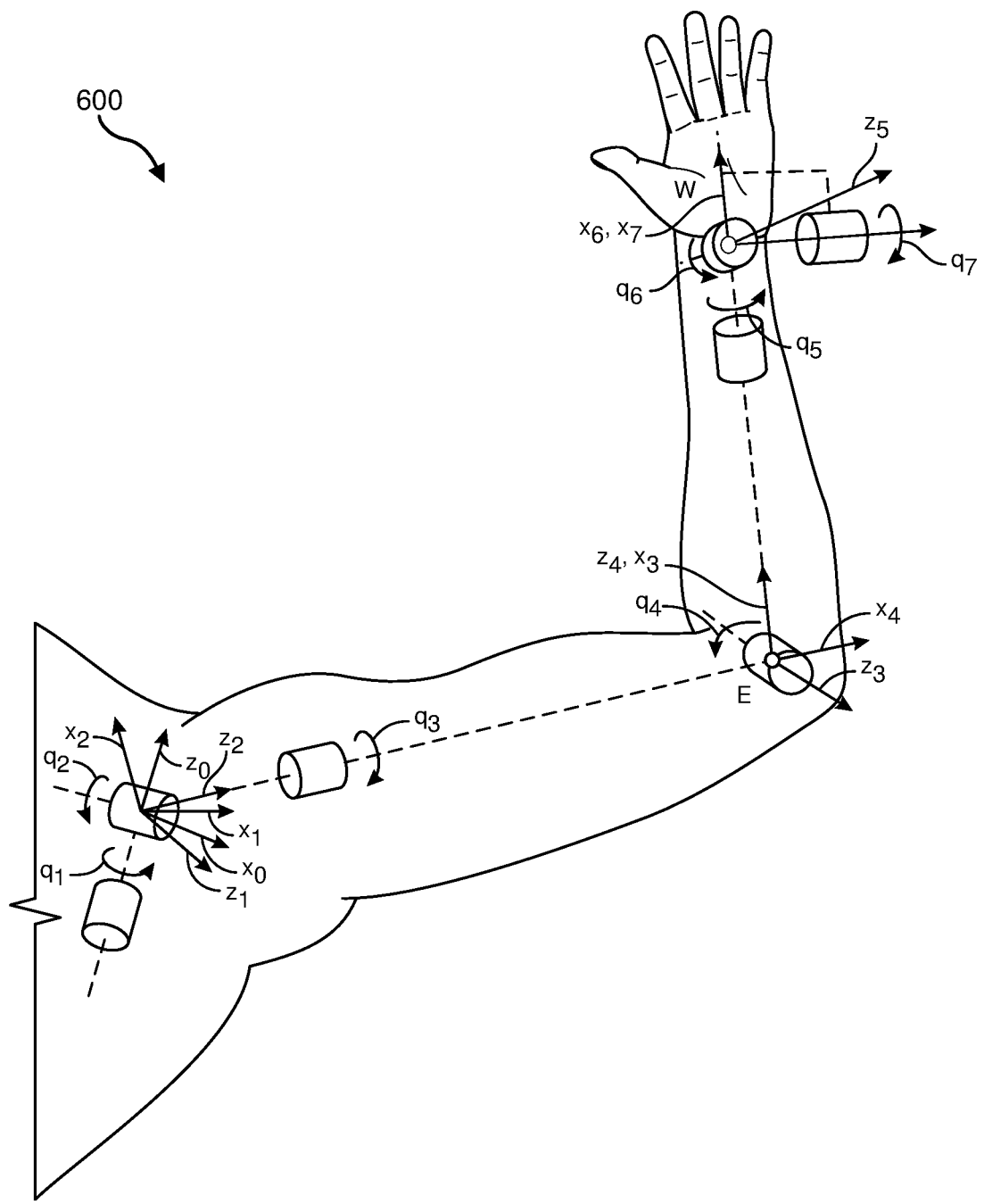
FIG. 6 is a diagram of an arm model, according to aspects of the present disclosure.
Figure 7:
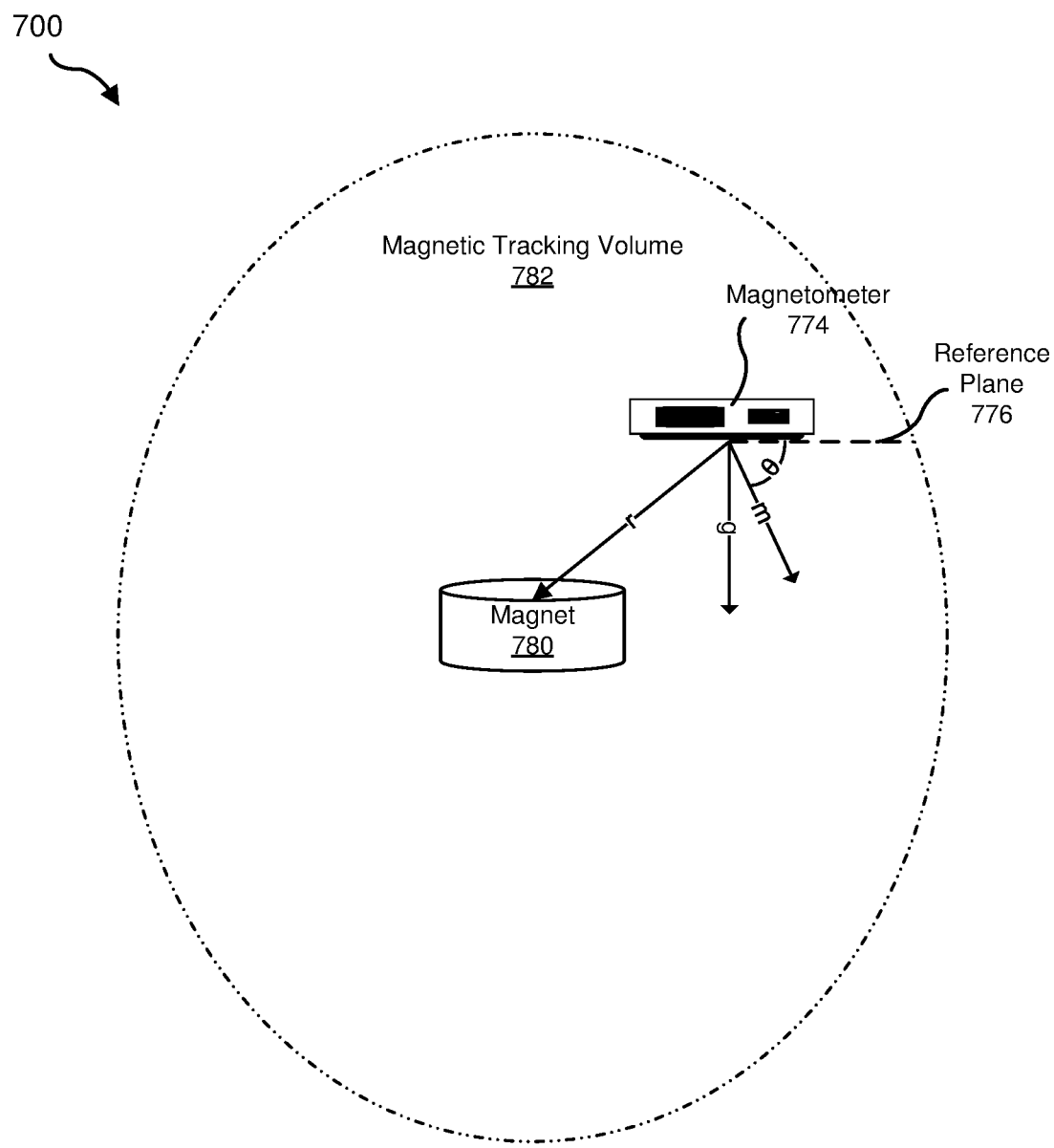
FIG. 7 is a block diagram of magnetic position tracking, according to aspects of the present disclosure.
Figure 8:
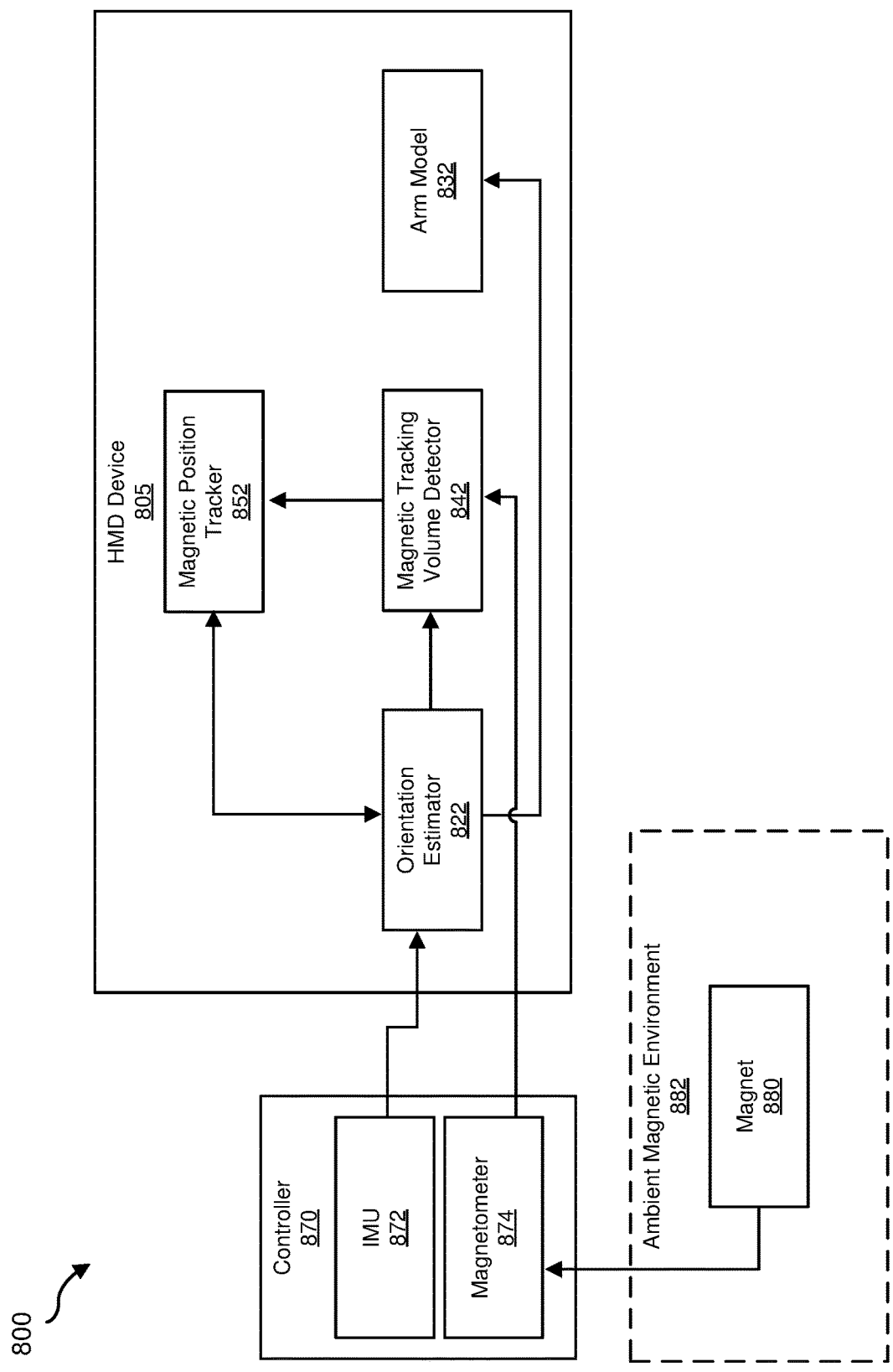
FIG. 8 is a block diagram of a workflow of transitioning DOF modes, according to aspects of the present disclosure.

The following will provide, with reference to FIGS. 1-8, detailed descriptions of systems and methods capable of transitioning between a low-order DOF mode and a high-order DOF mode using magnetic position tracking for the high-order DOF mode. FIG. 1 illustrates an exemplary process of transitioning from a low-order DOF mode to a high-order DOF mode. FIG. 2 illustrates an exemplary system for transitioning from a low-order DOF mode to a high-order DOF mode. FIG. 3 illustrates an exemplary VR system. FIG. 4 illustrates an exemplary HMD device. FIG. 5 illustrates an exemplary controller. FIG. 6 depicts an exemplary arm model that may be used for calculating additional DOF. FIG. 7 illustrates a diagram of an exemplary magnetic environment. FIG. 8 illustrates an exemplary workflow for transitioning from a low-order DOF mode to a high-order DOF mode.

FIG. 1 is a flow diagram of an exemplary computer-implemented method 100 for transitioning from a low-order DOF mode to a high-order DOF mode. The steps shown in FIG. 1 may be performed by any suitable computer-executable code and/or computing system, including the system(s) illustrated in FIGS. 2-5. In one example, each of the steps shown in FIG. 1 may represent an algorithm whose structure includes and/or is represented by multiple sub-steps, examples of which will be provided in greater detail below.

As illustrated in FIG. 1, at step 110 one or more of the systems described herein may track, using a low-order degree-of-freedom (DOF) mode, an orientation of a device based on input from an inertial measurement unit (IMU) of the device.

In some embodiments, the term "degree-of-freedom" may refer to a number of parameters that may correspond to independent motions. Examples of independent motions for determining DOF include, without limitation, rotations about an axis, translations across an axis, accelerations, etc. A high-order DOF may refer to a larger DOF than a low-order DOF. A low-order DOF may be, for example, three degrees-of-freedom (3DOF), which may correspond to roll, yaw, and pitch. A high-order DOF may be, for example, six degrees-of-freedom (6DOF), which may include 3DOF parameters as well as position along the x, y, and z axes.

The systems described herein may perform step 110 in a variety of ways. FIG. 2 is a block diagram of an example system 200 for transitioning between low-order and high-order DOF modes. As illustrated in this figure, example system 200 may include one or more modules 202 for performing one or more tasks. As will be explained in greater detail below, modules 202 may include a low-order tracking module 204, a determining module 206, a transition module 208, and a high-order tracking module 210. Although illustrated as separate elements, one or more of modules 202 in FIG. 2 may represent portions of a single module or application.

In certain embodiments, one or more of modules 202 in FIG. 2 may represent one or more software applications or programs that, when executed by a computing device, may cause the computing device to perform one or more tasks. For example, and as will be described in greater detail below, one or more of modules 202 may represent modules stored and configured to run on one or more computing devices, such as the devices illustrated in FIG. 3 (e.g., head-mounted display device 305, controller 370, and/or processing subsystem 310). One or more of modules 202 in FIG. 2 may also represent all or portions of one or more special-purpose computers and/or devices configured to perform one or more tasks.

As illustrated in FIG. 2, example system 200 may also include one or more memory devices, such as memory 240. Memory 240 generally represents any type or form of volatile or non-volatile storage device or medium capable of storing data and/or computer-readable instructions. In one example, memory 240 may store, load, and/or maintain one or more of modules 202. Examples of memory 240 include, without limitation, Random Access Memory (RAM), Read Only Memory (ROM), flash memory, Hard Disk Drives (HDDs), Solid-State Drives (SSDs), optical disk drives, caches, variations or combinations of one or more of the same, and/or any other suitable storage memory.

As illustrated in FIG. 2, example system 200 may also include one or more physical processors, such as physical processor 230. Physical processor 230 generally represents any type or form of hardware-implemented processing unit capable of interpreting and/or executing computer-readable instructions. In one example, physical processor 230 may access and/or modify one or more of modules 202 stored in memory 240. Additionally or alternatively, physical processor 230 may execute one or more of modules 202 to facilitate transitions between low-order and high-order DOF modes. Examples of physical processor 230 include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, and/or any other suitable physical processor.

As illustrated in FIG. 2, example system 200 may also include and/or be coupled to one or more additional elements 220, such as an inertial measurement unit (IMU) 272, a magnetometer 274, and a magnet 280. IMU 272, magnetometer 274, and/or magnet 280 may be incorporated in an input device coupled to system 200. IMU 272 may be a sensor or device capable of measuring, for instance, acceleration and/or angular rate, and may comprise an accelerometer and/or gyroscope. IMU 272 may be associated with the low-order DOF, such as 3DOF, as will be explained further below. Magnetometer 274 may be a sensor capable of measuring magnetic fields, for instance direction, strength and/or relative change of a magnetic field. Magnet 280 may be a magnet capable of being detected by magnetometer 274 and may be disposed separate and independent from magnetometer 274, as will be explained further below.

Example system 200 in FIG. 2 may be implemented in a variety of ways. For example, all or a portion of example system 200 may represent portions of example head-mounted display (HMD) system 300 in FIG. 3.

FIG. 3 is a block diagram of one embodiment of HMD system 300 that presents scenes (e.g., captured scenes, artificially-generated scenes, or a combination of the same) to a user. HMD system 300 may operate in a virtual reality (VR) system environment, an augmented reality (AR) system environment, a mixed reality (MR) system environment, or some combination thereof. HMD system 300 shown in FIG. 3 may include an HMD device 305 that includes or communicates with processing subsystem 310 and an input/output (I/O) interface 315. HMD device 305 may completely obstruct the user's view of the real-world environment, in some embodiments. Other embodiments may only partially obstruct the user's view of the real-world environment and/or may obstruct the user's view depending on content being displayed in a display of HMD device 305.

While FIG. 3 shows an exemplary HMD system 300 that includes at least one HMD device 305 and at least one I/O interface 315, in other embodiments any number of these components may be included in HMD system 300. For example, there may be multiple HMDs 305, each having an associated I/O interface 315, with each HMD device 305 and I/O interface 315 communicating with processing subsystem 310. In embodiments in which processing subsystem 310 is not included within or integrated with HMD device 305, HMD device 305 may communicate with processing subsystem 310 over a wired connection or a wireless connection. In alternative configurations, different and/or additional components may be included in HMD system 300. Additionally, functionality described in connection with one or more of the components shown in FIG. 3 may be distributed among the components in a different manner than described with respect to FIG. 3, in some embodiments.

HMD device 305 may present a variety of content to a user, including virtual views of an artificially rendered virtual-world environment and/or augmented views of a physical, real-world environment, augmented with computer-generated elements (e.g., two-dimensional (2D) or three-dimensional (3D) images, 2D or 3D video, sound, etc.). In some embodiments, the presented content includes audio that is presented via an internal or external device (e.g., speakers and/or headphones) that receives audio information from HMD device 305, processing subsystem 310, or both, and presents audio data based on the audio information. In some embodiments, such speakers and/or headphones may be integrated into or releasably coupled or attached to HMD device 305. HMD device 305 may include one or more bodies, which may be rigidly or non-rigidly coupled together. A rigid coupling between rigid bodies may cause the coupled rigid bodies to act as a single rigid entity. In contrast, a non-rigid coupling between rigid bodies may allow the rigid bodies to move relative to each other. An embodiment of HMD device 305 is an HMD device 400 shown in FIG. 4 and described in further detail below.

In some examples, HMD device 305 may include a an electronic display 325 and/or an inertial measurement unit (IMU) 340. Some embodiments of HMD device 305 may include an optional image capture subsystem 330 that includes one or more cameras, and/or an optional depth-sensing subsystem 320 (or depth camera system). Other embodiments of HMD device 305 may include an optional eye-tracking or gaze-estimation system configured to track the eyes of a user of HMD device 305 to estimate the user's gaze. An optional varifocal module may be configured to adjust the focus of one or more images displayed on electronic display 325 based on the determined eye-tracking information obtained from the eye-tracking system and other components. Some embodiments of HMD device 305 may include additional position sensors. Some embodiments of HMD device 305 may have different components than those described in conjunction with FIG. 3.

Depth-sensing subsystem 320 may capture data describing depth information characterizing a local real-world area or environment surrounding some or all of HMD device 305 and/or characterizing a position, velocity, or position of depth-sensing subsystem 320 (and thereby of HMD device 305) within the local area. Depth-sensing subsystem 320 can compute the depth information using collected data (e.g., based on a captured light according to one or more computer-vision schemes or algorithms, by processing a portion of a structured light pattern, by time-of-flight (ToF) imaging, simultaneous localization and mapping (SLAM), etc.) or depth-sensing subsystem 320 can transmit this data to another device such as an external implementation of processing subsystem 310 that can determine the depth information using the data from depth-sensing subsystem 320.

Electronic display 325 may display two-dimensional or three-dimensional images to the user in accordance with data received from processing subsystem 310. In various embodiments, electronic display 325 includes a single electronic display or multiple electronic displays (e.g., a display for each eye of a user). Examples of electronic display 325 may include: a liquid crystal display (LCD), an organic light emitting diode (OLED) display, an inorganic light emitting diode (ILED) display, an active-matrix organic light-emitting diode (AMOLED) display, a transparent organic light emitting diode (TOLED) display, another suitable display, or some combination thereof. Electronic display 325 may be opaque such that the user cannot see the local environment through electronic display 325.

Image capture subsystem 330 may include one or more optical image sensors or cameras that capture and collect image data from a local environment. In some embodiments, the sensors included in image capture subsystem 330 may provide stereoscopic views of the local environment that may be used by processing subsystem 310 to generate image data that characterizes the local environment and/or a position and orientation of HMD device 305 within the local environment. For example, the image capture subsystem 330 may include simultaneous localization and mapping (SLAM) cameras or other cameras that include a wide-angle lens system that captures a wider field-of-view than may be captured by the eyes of the user. As described herein, the image capture subsystem 330 may provide pass-through views of the real-world environment that are displayed to the user via the electronic display 325 when HMD system 300 is in a boundary definition state.

In some embodiments, processing subsystem 310 may process the images captured by image capture subsystem 330 to remove distortion caused by the lens system of image capture subsystem 330 and/or by a separation distance between two image sensors that is noticeably larger than or noticeably less than an average separation distance between users' eyes. For example, when image capture subsystem 330 is, or is part of, a SLAM camera system, direct images from image capture subsystem 330 may appear distorted to a user if shown in an uncorrected format. Image correction or compensation may be performed by processing subsystem 310 to correct and present the images to the user with a more natural appearance, so that it appears to the user as if the user is looking through electronic display 325 of HMD device 305. In some embodiments, image capture subsystem 330 may include one or more image sensors having lenses adapted (in terms of field-of-view, separation distance, etc.) to provide pass-through views of the local environment. Image capture subsystem 330 may capture color image or monochromatic images.

IMU 340 may, in some examples, represent an electronic subsystem that generates data indicating a position and/or orientation of HMD device 305 based on measurement signals from sensors such as accelerometers and/or gyroscopes of IMU 340 and from depth information received from depth-sensing subsystem 320 and/or image capture subsystem 330. For example, an accelerometer of IMU 340 may generate one or more measurement signals in response to motion of HMD device 305. Examples of sensors for IMU 340 include: one or more accelerometers, one or more gyroscopes, one or more magnetometers, another suitable type of sensor that detects motion, a type of sensor used for error correction of IMU 340, or some combination thereof. Sensors may be located external to IMU 340, internal to IMU 340, or some combination thereof. In some examples, IMU 340 may comprise a 6-axis IMU, which may include accelerometers and gyroscopes. In some examples, IMU 340 may comprise a 9-axis IMU, which may include accelerometers, gyroscopes, and magnetometers.

Based on the one or more measurement signals from the sensors, IMU 340 may generate data indicating an estimated current position, elevation, and/or orientation of HMD device 305 relative to an initial position and/or orientation of HMD device 305. For example, multiple accelerometers may measure translational motion (forward/back, up/down, left/right) and multiple gyroscopes may measure rotational motion (e.g., pitch, yaw, roll). As described herein, image capture subsystem 330 and/or depth-sensing subsystem 320 may generate data indicating an estimated current position and/or orientation of HMD device 305 relative to the real-world environment in which HMD device 305 is used.

I/O interface 315 may represent a subsystem or device that allows a user to send action requests and receive responses from processing subsystem 310 and/or a controller 370. In some embodiments, controller 370 may comprise a hand-held controller or other device that may be manipulated by the user to provide input, such as orientation and/or position data as sensed by sensors of controller 370, such as IMU 372 and/or magnetometer 374 to I/O interface 315. IMU 372 may be an IMU, similar to IMU 340, which may be capable of detecting an orientation of controller 370. Magnetometer 374 may be a magnetometer capable of detecting a magnetic field, such as the magnetic field from a magnet 380. In other embodiments, controller 370 may provide passive input to I/O interface 315. For example, controller 370 may comprise the user's finger or hand, a glove or other wearable object, a hand-held object, the user's eyes and/or gaze, and/or another user-manipulatable object which may be detected by sensors of HMD system 300 to determine orientation and/or position data relative to controller 370. In some embodiments, magnet 380 may be included in controller 370 and magnetometer 374 may be external to controller 370. In some embodiments, I/O interface 315 may facilitate communication with more than one controller 370. For example, the user may have two controllers 370, one in each hand. An action request may, in some examples, represent a request to perform a particular action. For example, an action request may be an instruction to start or end capture of image or video data or an instruction to perform a particular action within an application or to start or end a boundary definition state. I/O interface 315 may include one or more input devices or enable communication with one or more input devices. Exemplary input devices may include a keyboard, a mouse, a hand-held controller, or any other suitable device for receiving action requests and communicating the action requests to processing subsystem 310.

An action request received by I/O interface 315 may be communicated to processing subsystem 310, which may perform an action corresponding to the action request. In some embodiments, controller 370 includes an IMU 340 that captures inertial data indicating an estimated position of controller 370 relative to an initial position. In some embodiments, I/O interface 315 and/or controller 370 may provide haptic feedback to the user in accordance with instructions received from processing subsystem 310 and/or HMD device 305. For example, haptic feedback is provided when an action request is received or processing subsystem 310 communicates instructions to I/O interface 315 causing I/O interface 315 to generate or direct generation of haptic feedback when processing subsystem 310 performs an action.

Processing subsystem 310 may include one or more processing devices or physical processors that provide content to HMD device 305 in accordance with information received from one or more of: depth-sensing subsystem 320, image capture subsystem 330, I/O interface 315, and controller 370. In the example shown in FIG. 3, processing subsystem 310 includes an application store 350 and a tracking module 355. Some embodiments of processing subsystem 310 have different modules or components than those described in conjunction with FIG. 3. For example, some embodiments of processing subsystem 310 may include an optional image processing engine 360. Similarly, the functions further described below may be distributed among the components of HMD system 300 in a different manner than described in conjunction with FIG. 3.

Application store 350 may store one or more applications for execution by processing subsystem 310. An application may, in some examples, represent a group of instructions, that when executed by a processor, generates content for presentation to the user. Content generated by an application may be generated in response to inputs received from the user via movement of HMD device 305 or controller 370. Examples of applications include: gaming applications, conferencing applications, video playback applications, or other suitable applications.

Tracking module 355 may calibrate HMD system 300 using one or more calibration parameters and may adjust one or more calibration parameters to reduce error in determination of the position of HMD device 305 or controller 370. For example, tracking module 355 may communicate a calibration parameter to depth-sensing subsystem 320 to adjust the focus of depth-sensing subsystem 320 to more accurately determine positions of structured light elements captured by depth-sensing subsystem 320. Calibration performed by tracking module 355 may also account for information received from IMU 340 in HMD device 305 and/or another IMU 340 included in controller 370. Additionally, if tracking of HMD device 305 is lost (e.g., depth-sensing subsystem 320 loses line of sight of at least a threshold number of structured light elements), tracking module 355 may recalibrate some or all of HMD system 300.

Tracking module 355 may track movements of HMD device 305 and/or of controller 370 using information from depth-sensing subsystem 320, image capture subsystem 330, IMU 340, IMU 372, magnetometer 374, or some combination thereof. For example, tracking module 355 may determine a position of a reference point of HMD device 305 in a mapping of the real-world environment based on information collected with HMD device 305. Additionally, in some embodiments, tracking module 355 may use portions of data indicating a position and/or orientation of HMD device 305 and/or controller 370 from IMU 340, IMU 372, and/or magnetometer 374 to predict a future position and/or orientation of HMD device 305 and/or controller 370. Tracking module 355 may also provide the estimated or predicted future position of HMD device 305 or I/O interface 315 to engine 360.

In some embodiments, tracking module 355 may track other features that can be observed by depth-sensing subsystem 320, image capture subsystem 330, and/or by another system. For example, tracking module 355 may track one or both of the user's hands so that the location of the user's hands within the real-world environment may be known and utilized. Tracking module 355 may receive and process data in order to determine a pointing direction of a finger of one of the user's hands, for instance when controller 370 comprises the user's hands. Tracking module 355 may also receive information from one or more eye-tracking cameras included in some embodiments of HMD device 305 to tracking the user's gaze.

Image processing engine 360 may generate a three-dimensional mapping of the area surrounding some or all of HMD device 305 (i.e., the "local area" or "real-world environment) based on information received from HMD device 305. In some embodiments, engine 360 determines depth information for the three-dimensional mapping of the local area based on information received from depth-sensing subsystem 320 that is relevant for techniques used in computing depth. Engine 360 may calculate depth information using one or more techniques in computing depth from structured light. In various embodiments, engine 360 uses the depth information to, e.g., update a model of the local area, and generate content based in part on the updated model.

Engine 360 may also execute applications within HMD system 300 and receive position information, acceleration information, velocity information, predicted future positions, or some combination thereof, of HMD device 305 from tracking module 355. Based on the received information, engine 360 may determine content to provide to HMD device 305 for presentation to the user. For example, if the received information indicates that the user has looked to the left, engine 360 generates content for HMD device 305 that corresponds to the user's movement in a virtual environment or in an environment augmenting the local area with additional content. Additionally, engine 360 may perform an action within an application executing on processing subsystem 310 in response to an action request received from I/O interface 315 and/or controller 370 and provide feedback to the user that the action was performed. The provided feedback may be visual or audible feedback via HMD device 305 or haptic feedback via controller 370.

FIG. 4 is a diagram of HMD device 400, in accordance with one embodiment of HMD device 305. HMD device 400 may include an imaging subsystem and a depth-sensing subsystem. HMD device 400 may be part of, e.g., a VR system, an AR system, an MR system, or some combination thereof. In embodiments that describe an AR system and/or an MR system, portions of a front side 402 of HMD device 400 are at least partially transparent in the visible band (about 380 nanometers (nm) to 750 nm). More specifically, portions of HMD device 400 that are between front side 402 of HMD device 400 and an eye of the user may be at least partially transparent (e.g., a partially-transparent electronic display 325). In other embodiments, front side 402 is opaque, preventing the user from seeing the real-world environment. HMD device 400 may include a front rigid body 405 housing the electronic display 325 and other components, a user attachment system such as a band 410 that secures HMD device 400 to a user's head, and a reference point 415 that can characterize a position and/or orientation of HMD device 400.

In addition, some embodiments of HMD device 400 may include an optional imaging aperture 420 and/or an optional illumination aperture 425. An illumination source included in depth-sensing subsystem 320 may emit light (e.g., structured light) through illumination aperture 425. An imaging device of depth-sensing subsystem 320 may capture light from the illumination source that is reflected or backscattered from the local area through imaging aperture 420. Some embodiments of HMD device 400 may further include optional cameras 440A and 440B that may be components of image capture subsystem 330 of FIG. 3. Cameras 440A and 440B may be separated from each other by a distance that is different than the average separation distance between users' eyes.

Front rigid body 405 may include one or more electronic display elements, one or more integrated eye-tracking systems, an IMU 430, and reference point 415. IMU 430 may represent an electronic device that measures a motion of HMD device 400 and may include, for example, an accelerometer and/or a gyroscope. An accelerometer may measure a linear acceleration of the accelerometer with respect to the ground and may include motion-induced acceleration and gravitational acceleration. A gyroscope may measure an angular velocity of the gyroscope with respect to the ground, which may correspond to a rate of change of roll, pitch, and yaw.

HMD device 400 may correspond to HMD device 305. In some examples, HMD device 400 may further include portions or all of processing subsystem 310. For instance, HMD device 400 may operate without requiring a separate computing device for image processing, tracking, and other processing. HMD device 400 may operate with an input device, such as controller 370.

FIG. 5 is a perspective view of an exemplary hand-held controller 500 that may be an embodiment of controller 370 included in HMD system 300 of FIG. 3, in accordance with some embodiments. HMD system 300 may include one or more hand-held controllers like controller 500. For example, HMD system 300 may include two hand-held controllers 500, with one hand-held controller 500 for each of a user's right and left hands. Each hand-held controller 500 may be communicatively coupled to HMD device 305 and/or to a computing device (e.g., a personal computer, processing subsystem 310, etc.). Hand-held controller 500 may be communicatively coupled to HMD device 305 via any suitable wireless and/or wired connection.

As shown in FIG. 5, hand-held controller 500 may include a grip 502 sized to fit within a user's hand. Hand-held controller 500 may include an IMU 572, which may be internal to hand-held controller 500. IMU 572 may be an IMU, which may include an accelerometer, gyroscope, and/or other sensors capable of detecting an orientation of hand-held controller 500. IMU 572 may allow for a low-order DOF tracking, such as 3DOF tracking.

Hand-held controller 500 may include a magnetometer 574, which may be internal to hand-held controller 500. Magnetometer 574 may be a magnetometer or any other sensor capable of detecting and/or measuring magnetic fields, including a strength and/or direction of magnetic fields. Magnetometer 574, in conjunction with IMU 572, may allow for a high-order DOF tracking, such as 6DOF tracking, as will be described further below.

FIG. 5 further illustrates a magnet 580, which may correspond to magnet 380. Magnet 580 may be detected by magnetometer 574. In FIG. 5, magnet 580 may be incorporated into a wearable apparatus, such as a ring. In other examples, magnet 580 may one or more magnets which may be incorporated into other wearable apparatuses, such as gloves, or other devices, such as a base station, embedded into a surface, such as a table surface, or incorporated into a movable marker.

Returning to FIG. 1, the systems described herein may perform step 110 in a variety of ways. In one example, low-order tracking module 204 of system 200 may track the orientation of a device based on input from IMU 272. In another example, tracking module 355 may track the orientation of controller 370 or controller 500 based on input from IMU 372.

The orientation of the device may be tracked in a low-order DOF mode, such as 3DOF mode. The orientation, such as pitch, yaw, and roll, of the device may correspond to the low-order DOF. Additional DOF, such as for a high-order DOF, may not be detectable or otherwise available in the low-order DOF mode. For example, a position of the device along x, y, and z axes may not be available or detectable using an IMU. In some examples, the low-order DOF mode may include approximating or estimating additional DOF using available DOF measurements.

For example, in the low-order DOF mode, the orientation of controller 500 may be used to approximate the position of controller 500. An arm model, such as arm model 600 in FIG. 6, may be used to approximate the position of controller 500 based on the orientation of controller 500. The orientation of controller 500 may be divided into components and attributed to a shoulder (e.g., q1, q2, q3), elbow (e.g., q4), and wrist (e.g., q5, q6, q7) of arm model 600. For instance, a percentage of each component may be attributed to arm model 600. The displacement due to the shoulder's orientation (e.g., x0, x1, x2, z0, z1, z2), elbow's orientation (e.g., x3, x4, z3, z4), and wrist's orientation (x6,7, z5) may be used to estimate a position of controller 500. Arm model 600 may be predetermined or may be calibrated by the user, for example by having the user pose his or her arm in specific poses and measuring the orientation of controller 500 in those poses.

Returning to FIG. 1, at step 120 one or more of the systems described herein may determine, using a magnetometer, that the device has entered a magnetic tracking volume defined by at least one magnet. For example, determining module 206 may determine, based on input from magnetometer 274, that the device has entered the magnetic tracking volume defined by magnet 280.

In some embodiments, the term "magnetic tracking volume" may refer to a volume of space defined by the magnetic field of a magnet, which may be detectable by a magnetometer. Boundaries of a magnetic tracking volume may be determined by threshold strengths of the magnetic field. For example, beyond a certain distance from the magnet, the magnet's magnetic field may not satisfy the threshold strength. The threshold strength may be represented by confidence values, such as a magnitude of a magnetometer's measurement and variation of dip angles detected by the magnetometer, as further explained below. A shape of the magnetic tracking volume may be based on number and placement of magnets, types of magnets, etc.

The systems described herein may perform step 120 in a variety of ways. In one example, tracking module 355 may determine, based on magnetometer 374 of controller 370 detecting magnet 380, that controller 370 has entered the magnetic tracking volume.

In some examples, the magnetic tracking volume may be defined by a plurality of magnets. For instance, magnet 380 may comprise a plurality of magnets. The plurality of magnets may define a different magnetic tracking volume than a single magnet, such as a larger magnetic tracking volume. The plurality of magnets may also increase the accuracy and/or precision of position tracking, for instance by producing stronger magnetic fields which may be better detected by magnetometer 374.

In some examples, the magnet may be a passive magnet. For example, magnet 380 may be a permanent magnet or made of magnetic and/or magnetized material. Alternatively, magnet 380 may be an electromagnet which may be powered to produce the magnetic field for the magnetic tracking volume.

In some examples, the magnet may be external to the device. For instance, magnet 380 may be external to controller 370 and/or controller 500. Magnet 380 may be placed on a surface, such as a table or desk, near the user. Magnet 380 may be disposed in a wearable apparatus such as a glove or ring (see e.g., magnet 580), a base station, and/or a writing pad such as a writing tablet. Controller 370 may include magnetometer 374.

In some examples, the magnet may be disposed in the device. For instance, magnet 380 may be disposed in controller 370 and magnetometer 374 may be external to controller 370.

Determining whether the magnetometer is near the magnet may include comparing temporal and spatial variances in magnetometer measurements with constant values. More specifically, in some examples, determining that the device has entered the magnetic tracking volume may include determining a confidence magnitude based on a magnitude of a magnetic field detected by the magnetometer and at least one reference magnitude, determining a confidence dip angle based on a speed of change of the dip angle of the magnetic field with respect to a reference horizontal plane and at least one reference dip angle variance, determining a combined confidence value based on the confidence magnitude and the confidence dip angle, and determining that the device has entered the magnetic tracking volume when the combined confidence value satisfies a combined confidence threshold.

In some embodiments, the term "magnitude (of the magnetic field)" may refer to a measurement or other representation of magnetic field, such as magnetic flux density measured in gauss. In some embodiments, the term "dip angle (of the magnetic field)" may refer to an angle made with respect to a reference plane by magnetic field lines. For example, the reference plane may be a reference horizontal plane which may be parallel to a tangent plane at a point on the earth's surface or may be defined by a direction of gravity. The dip angle may vary based on a location on the earth's surface. For example, near Finland the dip angle may be 90 degrees whereas near the equator the dip angle may be 0 degrees. The magnetic field lines may be field lines associated with the magnetic field from the magnet. In some embodiments, calculations with respect to magnetic fields may include corrections or otherwise account for the earth's magnetic fields.

FIG. 7 shows how magnetic position tracking may be calculated from magnetic distortion detection in an ambient magnetic environment 700. In FIG. 7, a magnet 780, which may correspond to magnet 280 and/or magnet 380, may define a magnetic tracking volume 782. A magnetometer 774 may be within magnetic tracking volume 782 and capable of detecting magnetic fields therein. Based on the position of magnetometer 774 with respect to magnet 780, a magnetic field m detected by magnetometer 774 may vary. In addition, an angle θ between m and reference plane 776 may correspond to the dip angle.

When the magnetic field detected satisfies confidence threshold values, the magnetometer 774 may be in close enough proximity to magnet 780 to reliably perform magnetic position tracking. Thus, the boundaries of magnetic tracking volume 782 may correspond to maximum distances from magnet 780 from which magnetic position tracking may be reliable. The confidence threshold values may include a confidence magnitude and a confidence dip angle.

The confidence magnitude $C_m$ may be calculated based on Equation 1.

$$C_m = (|m| - |m|_{avg0} - |m|_{std0})/|m|_{std0} \quad \text{Equation 1:}$$

$|m|_{avg0}$ and $|m|_{std0}$ may be reference magnitudes based on magnetic field measurements captured in a clean environment, such as an average magnetic field magnitude and a standard magnetic field magnitude, respectively.

The confidence dip angle $C_\theta$ may be calculated based on Equation 2.

$$C_\theta = (\theta_{std} - \theta_{std_{avg0}} - \theta_{std_{std0}})/\theta_{std_{std0}} \quad \text{Equation 2:}$$

$\theta_{std}$ may be a dip angle variance based on running statistics, and may correspond to the speed of change of the dip angle. $\theta_{std_{avg0}}$ and $\theta_{std_{std0}}$ may be reference dip angles based on measurements captured in a clean environment, such as an average dip angle variance and a standard dip angle variance, respectively.

The dip angle may be calculated based on Equation 3.

$$\theta_{dip} = (pi/2) - \arccos(\vec{g} \cdot \vec{m}) \quad \text{Equation 3:}$$

As illustrated in FIG. 7, gravitational force g may be normal to reference plane 776.

The combined confidence value may be a combination of the confidence magnitude and the confidence dip angle, for example a maximum between the confidence magnitude and the confidence dip angle. In some examples, the combined confidence threshold may be based on a running average of combined confidence values. For instance, the combined confidence threshold may be based on a running average with a window of 100 values. If the combined confidence value satisfies the confidence threshold, for example is greater than or equal to the confidence threshold, the device may be determined to have entered the magnetic tracking volume.

Turning back to FIG. 1, at step 130 one or more of the systems described herein may, in response to determining that the device has entered the magnetic tracking volume, transition from the low-order DOF mode to a high-order DOF mode that tracks a higher number of DOFs than the low-order DOF mode. For example, transition module 208 may transition from the low-order DOF mode to the high-order DOF mode.

In some embodiments, the term "low-order DOF mode" may refer to an input mode for tracking a controller based on low-order DOF input from the controller. The low-order DOF mode may track, for example, 3DOF. In some embodiments, the low-order DOF mode may approximate additional DOF, for instance by using an arm model.

In some embodiments, the term "high-order DOF mode" may refer to an input mode for tracking a controller based on high-order DOF input from the controller. The high-order DOF mode may track more DOF than the low-order DOF, for example 6DOF.

The systems described herein may perform step 130 in a variety of ways. In one example, tracking module 355 may, in response to determining that controller 370 has entered the magnetic tracking volume defined by magnet 380, transition from the low-order DOF mode to the high-order DOF mode by initiating magnetic position tracking based on input from magnetometer 374.

In some examples, the transition from the low-order DOF mode to the high-order DOF mode may be seamless, such that the user does not notice or is otherwise notified of the transition. In other examples, the user may be notified of the transition, for instance by being presented a notification that addition DOF tracking is available. The user may also be presented a different user interface for the high-order DOF mode. For example, the user may be presented a virtual interface, such as a virtual control panel, with which the user may interact with by taking advantage of the increased precision of tracking the controller afforded by the high-order DOF mode.

In some examples, a polling rate for magnetometer 374 may be increased for the high-order DOF mode. For instance, magnetometer 374 may be polled at a first rate when controller 370 is not detected within the magnetic tracking volume. When controller 370 is detected within the magnetic tracking volume, magnetometer 374 may be polled at a second rate suitable for real-time magnetic position tracking.

In some examples, transition module 208 may transition from the high-order DOF mode to the low-order DOF mode. For example, when controller 370 is no longer detected within the magnetic tracking volume, tracking module 355 may transition back to the low-order DOF mode and disable magnetic position tracking. The transitions between the low-order DOF mode and the high-order DOF mode may be automatic.

Returning to FIG. 1, at step 140 one or more of the systems described herein may track, using the high-order DOF mode, the position and orientation of the device based on input from both the IMU and the magnetometer. For example, high-order tracking module 210 may track the position and orientation of the device based on input from both IMU 272 and magnetometer 274.

The systems described herein may perform step 140 in a variety of ways. In one example, tracking module 355 may track the position of controller 370 based on input from magnetometer 374, and track the orientation of controller 370 based on input from IMU 372.

In some examples, the position of the device may be tracked based on a magnitude of a magnetic field detected by the magnetometer and an orientation of the magnetometer with respect to the at least one magnet. Turning to FIG. 7, the magnetic position tracking may be based on the magnitude of m and an orientation of magnetometer 774. Equation 4 shows how a location vector r, corresponding to a relative location or displacement of magnet 780 with respect to magnetometer 774, may be calculated.

$$H(r) = \frac{K}{r^3}\left[\frac{3r(m \cdot r)}{r^2} - m\right], \quad \text{Equation 4}$$

$$r = |r|,$$

$$K = \frac{M}{4\pi}$$

H may correspond to magnetic field vectors, which may be an input from magnetometer 774. H may comprise vector fields which include direction and magnitude components. Magnetometer 774 may measure the raw local magnetic field that may include a geomagnetic field (e.g., the environmental magnetic field that is detected locally) and the magnetic field from magnet 780. The geomagnetic field may be subtracted from the raw measurement to produce the input value H. The environmental magnetic field may be determined based on confidence values, described above. For example, when magnetometer 774 is not within or near magnetic tracking volume 782, a reference value for the environmental magnetic field may be updated based on the confidence value calculations. As magnetometer 774 approaches and/or enters magnetic tracking volume 782, the environmental magnetic field reference value may no longer be updated and instead subtracted from the raw measured magnetic field to produce H. Thus, H may represent the magnetic field from magnet 780.

H may be a three-dimensional vector field that may be measured with respect to a coordinate system for magnetometer 774. The vector m may be an additional input, corresponding to a unit vector for a magnetic field direction. Location vector r—which may correspond to a relative displacement between magnetometer 774 and magnet 780—may be solved, for instance, using a numerical solver such as Newton's method. In some examples, tracking module 355 may calculate location vector r based on input from magnetometer 374. Tracking module 355 may further convert location vector r into coordinates for a coordinate system used by tracking module 355 to determine the position of controller 370. Tracking module 355 may use input from IMU 372 to determine the orientation of controller 370, which may be used to transform measurements from magnetometer 774 into a reference frame for magnet 780. Tracking module 355 may therefore track the position and orientation of controller 370.

FIG. 8 shows a workflow 800 for transitioning between low-order and high-order DOF modes. A controller 870 may correspond to controller 370 and/or controller 500. Controller 870 may include an IMU 872, which may correspond to IMU 272, IMU 372, and/or IMU 572, and a magnetometer 874, which may correspond to magnetometer 274, magnetometer 374, magnetometer 574, and/or magnetometer 774. Magnetometer 874 may be capable of detecting magnetic fields from ambient magnetic environment 882 emanating from magnet 880. Magnet 880 may correspond to magnet 280, magnet 380, magnet 780, and/or magnet 780. Ambient magnetic environment 882 may correspond to ambient magnetic volume 782, which may also correspond to a magnetic tracking volume defined by magnet 880.

Controller 870 may be coupled to an HMD device 805. HMD device 805 may correspond to HMD device 305 and/or HMD device 400. HMD device 805 may include an orientation estimator 822, a magnetic tracking volume detector 842, an arm model 832, and a magnetic position tracker 852. Orientation estimator 822 may correspond to low-order tracking module 204 and/or tracking module 355. Magnetic tracking volume detector 842 may correspond to determining module 206, transition module 208, and/or tracking module 355. Magnetic position tracker 852 may correspond to high-order tracking module 210, and/or tracking module 355. Arm model 832 may correspond to arm model 600 and may be implemented in low-order tracking module 204 and/or tracking module 355.

As illustrated in FIG. 8, magnetometer 874 may provide input to magnetic tracking volume detector 842, which may determine whether controller 870 is within ambient magnetic environment 882 (e.g., high-order DOF mode) or is not within ambient magnetic environment 882 (e.g., low-order DOF mode). IMU 872 may provide input to orientation estimator 822 to determine an orientation of controller 870. In the low-order DOF mode, the orientation from orientation estimator 822 may be passed to arm model 832 to track the orientation and estimate a position of controller 870. In the high-order DOF mode, the orientation from orientation estimator 822 along with magnetic field values from magnetic tracking volume detector 842 may be passed to magnetic position tracker 852 to track the orientation and position of controller 870.

According to the aspects described herein, a user of an artificial reality system may use a hand-held controller in a 3DOF mode, tracking the orientation of the controller as input. When the user moves the controller into a magnetic tracking volume defined by a magnet, a magnetometer in the controller may detect the magnet and transition the artificial reality system to a 6DOF mode. The 6DOF mode may track the orientation and position of the controller based on inputs from an IMU and the magnetometer. The transition may be seamless and automatic such that the user's artificial reality experience may not be disrupted by the transition.

The 6DOF mode may allow for more accurate input control for the user. The user may notice the increased accuracy, for instance by allowing higher resolution input. In some examples, the artificial reality experience may change to better take advantage of the 6DOF mode. For example, the artificial reality experience may present virtual objects or virtual interfaces which may be precisely manipulated in the 6DOF mode, but which may not be usable in the 3DOF mode. Transitioning from the 6DOF mode to the 3DOF mode may result in removal of the virtual objects or virtual interfaces. The appearance and/or removal of these virtual objects or virtual interfaces may be seamless and concurrent with the appropriate transitions between the 3DOF and 6DOF modes. Alternatively, the artificial reality experience may not change significantly between the 3DOF and 6DOF modes, but the 6DOF mode may take advantage of the increased input precision from the controller. Thus, the artificial reality system may transition to the 6DOF mode when available, yet operate in the 3DOF mode when the 6DOF mode is not available.

As detailed above, the computing devices and systems described and/or illustrated herein broadly represent any type or form of computing device or system capable of executing computer-readable instructions, such as those contained within the modules described herein. In their most basic configuration, these computing device(s) may each include at least one memory device and at least one physical processor.

In some examples, the term "memory device" generally refers to any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

Although illustrated as separate elements, the modules described and/or illustrated herein may represent portions of a single module or application. In addition, in certain embodiments one or more of these modules may represent one or more software applications or programs that, when executed by a computing device, may cause the computing device to perform one or more tasks. For example, one or more of the modules described and/or illustrated herein may represent modules stored and configured to run on one or more of the computing devices or systems described and/or illustrated herein. One or more of these modules may also represent all or portions of one or more special-purpose computers configured to perform one or more tasks.

In addition, one or more of the modules described herein may transform data, physical devices, and/or representations of physical devices from one form to another. For example, one or more of the modules recited herein may receive sensor signal data to be transformed, transform the sensor signal data, output a result of the transformation to determine whether magnetic position tracking is available, use the result of the transformation for magnetic position tracking, and store the result of the transformation user input. Additionally or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

Embodiments of the instant disclosure may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A method comprising:
   tracking, using a low-order degree-of-freedom (DOF) mode, an orientation of a device based on input from an inertial measurement unit (IMU) of the device when the device is not detected within a magnetic tracking volume defined by at least one magnet;
   determining, using a magnetometer, that the device has entered the magnetic tracking volume by:
      determining a confidence magnitude based on a magnitude of the magnetic field and at least one reference magnitude;
      determining a confidence dip angle based on a speed of change of a dip angle of the magnetic field with respect to a reference horizontal plane and at least one reference dip angle variance;
      determining a combined confidence value based on the confidence magnitude and the confidence dip angle; and
      determining that the device has entered the magnetic tracking volume when the combined confidence value satisfies a combined confidence threshold based on a running average of combined confidence values;
   in response to determining that the device has entered the magnetic tracking volume, transitioning from the low-order DOF mode to a high-order DOF mode that tracks a higher number of DOFs than the low-order DOF mode; and
   tracking, using the high-order DOF mode, the position and orientation of the device based on input from both the IMU and the magnetometer.

2. The method of claim 1, wherein the position of the device is tracked based on a magnetic field detected by the magnetometer and an orientation of the magnetometer with respect to the at least one magnet.

3. The method of claim 1, wherein the magnetic tracking volume is defined by a plurality of magnets to increase the position tracking's precision.

4. The method of claim 1, wherein the at least one magnet comprises a passive magnet.

5. The method of claim 1, wherein the at least one magnet is disposed in at least one of a wearable apparatus, a base station, a writing pad, or the device.

6. The method of claim 1, wherein:
the device comprises the magnetometer and the at least one magnet is external to the device; or
the device comprises the at least one magnet and the magnetometer is external to the device.

7. The method of claim 1, wherein the high-order DOF mode tracks six degrees-of-freedom (6DOF) and the low-order DOF mode tracks three degrees-of-freedom (3DOF).

8. The method of claim 1, wherein a lower number of DOFs is detectable in the low-order DOF mode than in the high-order DOF mode.

9. The method of claim 1, wherein the running average is based on a window of at least 100 values.

10. A device comprising:
an inertial measurement unit (IMU) configured to track an orientation of the device;
a magnetometer configured to track a position of the device with respect to a magnetic tracking volume defined by at least one magnet; and
a tracking subsystem configured to:
track, using a low-order degree-of-freedom (DOF) mode, the orientation of the device based on input from the IMU when the device is not detected within the magnetic tracking volume;
determine, using the magnetometer, that the device has entered the magnetic tracking volume by:
determining a confidence magnitude based on a magnitude of the magnetic field and at least one reference magnitude;
determining a confidence dip angle based on a speed of change of a dip angle of the magnetic field with respect to a reference horizontal plane and at least one reference dip angle variance;
determining a combined confidence value based on the confidence magnitude and the confidence dip angle; and
determining that the device has entered the magnetic tracking volume when the combined confidence value satisfies a combined confidence threshold based on a running average of combined confidence values;
in response to determining that the device has entered the magnetic tracking volume, transition from the low-order DOF mode to a high-order DOF mode that tracks a higher number of DOFs than the low-order DOF mode; and
track, using the high-order DOF mode, the position and orientation of the device based on input from both the IMU and the magnetometer.

11. The device of claim 10, wherein the device comprises at least one of a hand-held controller, a glove, a stylus, or a head-mounted display.

12. The device of claim 10, wherein the position of the device is tracked based on a magnetic field detected by the magnetometer and an orientation of the magnetometer with respect to the at least one magnet.

13. The device of claim 10, wherein the magnetic tracking volume is defined by a plurality of magnets to increase the position tracking's precision.

14. The device of claim 10, wherein a lower number of DOFs is detectable in the low-order DOF mode than in the high-order DOF mode.

15. A system comprising:
at least one magnet defining a magnetic tracking volume;
a device comprising:
an inertial measurement unit (IMU) configured to track an orientation of the device; and
a magnetometer configured to track a position of the device with respect to the magnetic tracking volume; and
a processing system configured to:
track, using a low-order degree-of-freedom (DOF) mode, the orientation of the device based on input from the IMU when the device is not detected within the magnetic tracking volume;
determine, using the magnetometer, that the device has entered the magnetic tracking volume by:
determining a confidence magnitude based on a magnitude of the magnetic field and at least one reference magnitude;
determining a confidence dip angle based on a speed of change of a dip angle of the magnetic field with respect to a reference horizontal plane and at least one reference dip angle variance;
determining a combined confidence value based on the confidence magnitude and the confidence dip angle; and
determining that the device has entered the magnetic tracking volume when the combined confidence value satisfies a combined confidence threshold based on a running average of combined confidence values;
in response to determining that the device has entered the magnetic tracking volume, transition from the low-order DOF mode to a high-order DOF mode that tracks a higher number of DOFs than the low-order DOF mode; and
track, using the high-order DOF mode, the position and orientation of the device based on input from both the IMU and the magnetometer.

16. The system of claim 15, wherein the device comprises at least one of a hand-held controller, a glove, a stylus, or a head-mounted display.

17. The system of claim 15, wherein the processing system comprises at least one of a head-mounted display, a base station, or the device.

18. The system of claim 15, wherein the at least one magnet is disposed in at least one of a wearable apparatus, a base station, or a writing pad.

19. The system of claim 15, wherein tracking the position is based on a magnetic field detected by the magnetometer and an orientation of the magnetometer with respect to the at least one magnet.

20. The system of claim 15, wherein a lower number of DOFs is detectable in the low-order DOF mode than in the high-order DOF mode.

* * * * *